United States Patent
Chen et al.

[11] Patent Number: 5,869,882
[45] Date of Patent: Feb. 9, 1999

[54] ZENER DIODE STRUCTURE WITH HIGH REVERSE BREAKDOWN VOLTAGE

[75] Inventors: Wayne T. Chen, Plano; Ross E. Teggatz, McKinney; Taylor R. Efland, Richardson, all of Tex.

[73] Assignee: Texas Instruments Incorporated, Dallas, Tex.

[21] Appl. No.: 724,575

[22] Filed: Sep. 30, 1996

Related U.S. Application Data

[63] Continuation of Ser. No. 315,646, Sep. 30, 1994, abandoned.

[51] Int. Cl.$^6$ .......................... H01L 29/861; H01L 31/107
[52] U.S. Cl. .......................... 257/605; 257/603; 257/606; 257/493
[58] Field of Search .................................. 257/493, 603, 257/605, 606

[56] References Cited

U.S. PATENT DOCUMENTS

| | | |
|---|---|---|
| 3,767,981 | 10/1973 | Polata . |
| 4,590,664 | 5/1986 | Prentice et al. . |
| 4,713,681 | 12/1987 | Beasom . |
| 5,027,165 | 6/1991 | Doluca . |
| 5,077,590 | 12/1991 | Fujihira . |
| 5,336,920 | 8/1994 | Jimenez .................... 257/481 |
| 5,432,368 | 7/1995 | Jimenez .................... 257/355 |
| 5,434,442 | 7/1995 | Lesk et al. ................ 257/367 |
| 5,448,100 | 9/1995 | Beasom .................... 257/487 |

Primary Examiner—Ngân V. Ngô
Attorney, Agent, or Firm—Warren L. Franz; Wade James Brady, III; Richard L. Donaldson

[57] ABSTRACT

A zener diode capable of breakdown at much higher voltages than in the prior art is fabricated by providing a semiconductor substrate of a first conductivity type having an opposite conductivity type first tank disposed therein. The first tank includes relatively lower and relatively higher resistivity portions, the relatively lower doped portion isolating the relatively higher doped portion from the substrate. A first region of first conductivity type is disposed in the higher doped portion and a second region of opposite conductivity type and more highly doped than the first tank is spaced from the first region. Structure is provided between the first and second regions for repelling majority charge carriers associated with the opposite conductivity type which can be a field plate spaced from the first tank; a portion at the surface of the first tank having the first conductivity type; or a tank, of first conductivity type disposed in the first tank, abutting the first region, extending more deeply into the first tank than does the first region and more lightly doped than the first region. In accordance with a further embodiment, the diode includes a semiconductor substrate, a first tank portion disposed in the substrate and a second tank portion disposed in the first tank portion as in the prior embodiments. A first region of first conductivity type is disposed in the second tank portion and extends into the first tank portion. A second region of opposite conductivity type more highly doped than the first tank portion is disposed in the first tank portion and spaced from the first region.

9 Claims, 3 Drawing Sheets

ZENER DIODE STRUCTURE WITH HIGH REVERSE BREAKDOWN VOLTAGE

This application is a continuation of application Ser. No. 08/315,646, filed Sep. 30, 1994 (abandoned).

BACKGROUND OF THE INVENTION

1. Field of the Invention

This invention relates to zener diodes and, more specifically, to zener diodes having a relatively high reverse breakdown voltage.

2. Brief Description of the Prior Art

Zener diodes are a well known electronic components which have the property of acting as normal diodes in a circuit with conduction taking place in only one direction. However, if the voltage across the zener diode in the reverse direction reaches some known value, the diode will break down and conduct in the reverse direction. In most power integrated circuit designs, zener diodes are utilized for snubbing stacks and for protection of voltages across terminals. At present, low voltage NPN zener diode structures, generally with a breakdown voltage in the range of about 6 volts, are used to provide the above-described protection. The zener diode junction is formed by the base-to-emitter breakdown of an NPN device.

A disadvantage of the above-described structure is the low zener diode breakdown voltage. In many instances, a zener diode with a larger breakdown voltage, if available, would result in the need to implement fewer components. For example, gate-to-source voltage $V_{gs}$ protection zener diodes require that such protection be close to, but not exceed 20 volts. With 6.5 volt zener diodes, there would be a requirement for two such zener diodes and several base-to-emitter voltage $V_{be}$ to achieve the breakdown voltage. Another example is a low-side drain-to-gate snub stack where large voltages are required. There, the voltage involved is, for example, 60 volts, thereby requiring a large number of zener diodes for protection. This translates into the requirement that a large amount of die area must be used for the zener diodes alone, which is not economical. It is therefore apparent that a zener diode with a higher breakdown characteristic which also requires no additional die area or, at most, minimally more die area, would be highly desirable.

Another disadvantage with the NPN zener diode is that it requires additional process extensions in the fabrication process. Any process which would reduce the number of processing steps generally provides an economic advantage and this is always sought.

A further disadvantage is the problem of premature breakdown, also known as "punch through", of the NPN zener diode base region to the substrate. This occurs when the base region is brought up to a high enough potential to cause undesirable breakdown between the zener diode and the substrate.

SUMMARY OF THE INVENTION

In accordance with the present invention, the above described goals are accomplished and there is provided a zener diode capable of breakdown at much higher voltages than were obtainable in the prior art, generally about 17 volts, the diode being obtainable with a process that requires fewer processing steps than were required for the 6 volt range zener diode in the prior art, as well as minimizing the drift voltage of the zener structure over time.

Briefly, the zener diode is fabricated by providing a semiconductor substrate of a first conductivity type, preferably P-type, having a tank or well disposed in the substrate of second conductivity type which is opposite to the first conductivity type. The first tank includes a relatively lower doped portion and other doped portion, the relatively lower doped portion isolating the relatively higher doped portion from the substrate. A first region of first conductivity type (preferably to form a P+ anode) is disposed in the higher doped portion of the tank and a second region of second conductivity type (the same conductivity type as the tank) and more heavily doped than the tank (preferably to form an N+ cathode) is spaced from the first region. Contacts are provided to the first and second regions. The zener diode further includes structure between the first and second regions for repelling majority charge carriers associated with the second conductivity type. This structure can be, for example, (1) a field plate connected to the anode and spaced from the first tank, (2) a region of the first conductivity type at the surface of the tank having a conductivity type opposite to the that of the rest of the tank, or (3) a second tank of first conductivity type disposed in the first tank, the second tank abutting or closely spaced from the first region and extending more deeply into the first tank than does the first region and being more lightly doped than the first region.

In accordance with a further embodiment, the zener diode includes a semiconductor substrate of a first conductivity type, a first tank portion disposed in the substrate having a second conductivity type opposite to the first conductivity type and a second tank portion disposed in the first tank portion of the second a conductivity type and more heavily doped than the first tank portion. A region of first conductivity type is disposed in the second tank portion and extends into the first tank portion. A second region of second conductivity type which is more highly doped than the first tank portion is disposed in the first tank portion and spaced from the region of first conductivity type. Contacts are provided to the first and second regions.

DESCRIPTION OF THE PREFERRED EMBODIMENTS

Figure 1:
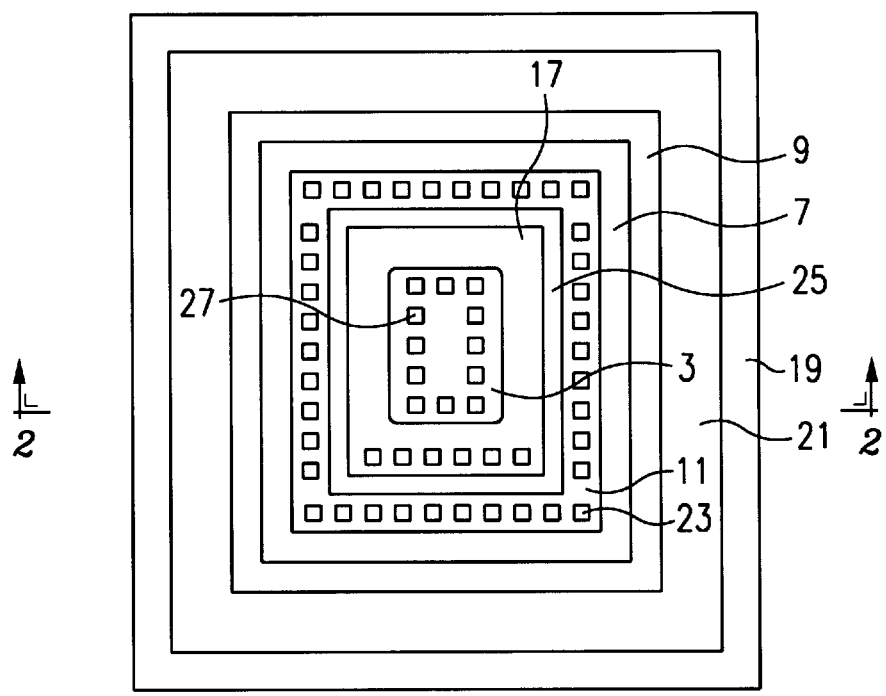
FIG. 1 is a top view of a zener diode, without metallization in accordance with a first embodiment of the present invention.
Figure 2:
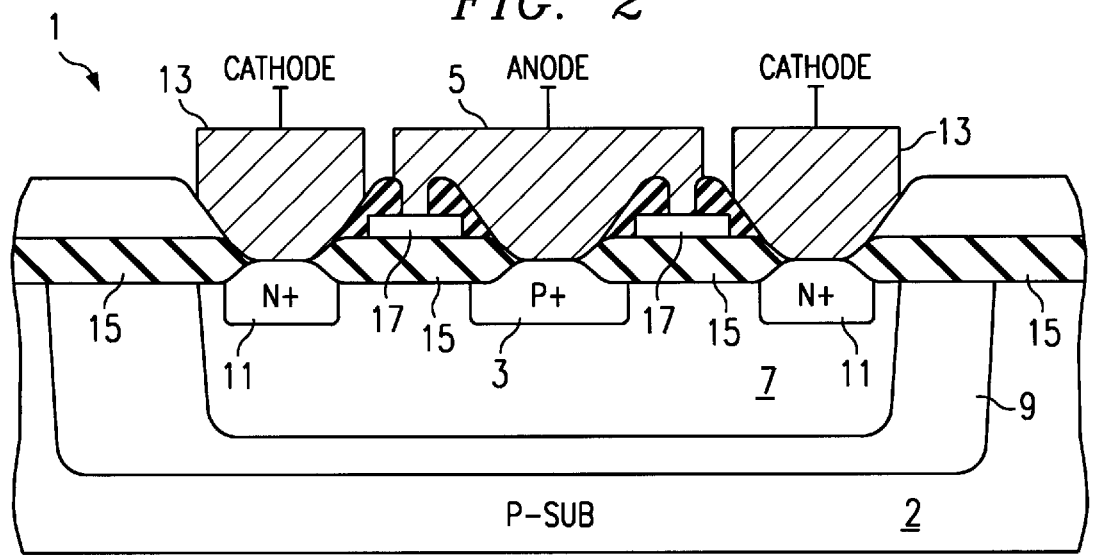
FIG. 2 is a cross section of the zener diode taken along the line 2—2 of FIG. 1, with metallization.

Referring first to FIGS. 1 and 2, there is shown a first embodiment of a zener diode 1 in accordance with the present invention. The junction of interest where breakdown takes place is provided between the P+ region 3, which is connected to an anode contact and metallization 5, and the N-type tank which is composed of an implanted low voltage (higher doped) N-type tank or well portion 7 within a high voltage (lower doped) N-type tank or well portion 9 within a P-type substrate 2. An N+ region 11, which is connected to a cathode contact and metallization 13, is generally ring-shaped and is used to make ohmic contact to the low voltage N-type tank portion 7 which is electrically connected to N-type tank portion 9. A layer of field oxide 15 is disposed on the surface of the tank 7, 9 and extends over a part of the P+ region 3 and N+ region 11, as well as beyond the cathode contact 13. A polycrystalline silicon field plate 17 is disposed over the field oxide 15 between the N+ region 11 and P+ region 3. The purpose of the field plate 17 is to spread out the E-fields that exist under the field oxide 15 near the P+ anode region 3, under reverse bias, to assist in making the breakdown more consistent and farther into the bulk of the tank 7, 9. Without the field plate 17, the current in the diode attempts to travel horizontally immediately below the field oxide 15 from the P+ region 3 to the N+ region 11. This causes charge build-up below the field oxide 15 that changes the breakdown voltage of the zener diode. The field plate 17 minimizes this charge build-up by repelling the charges into the bulk of the tank 7.

Figure 5:
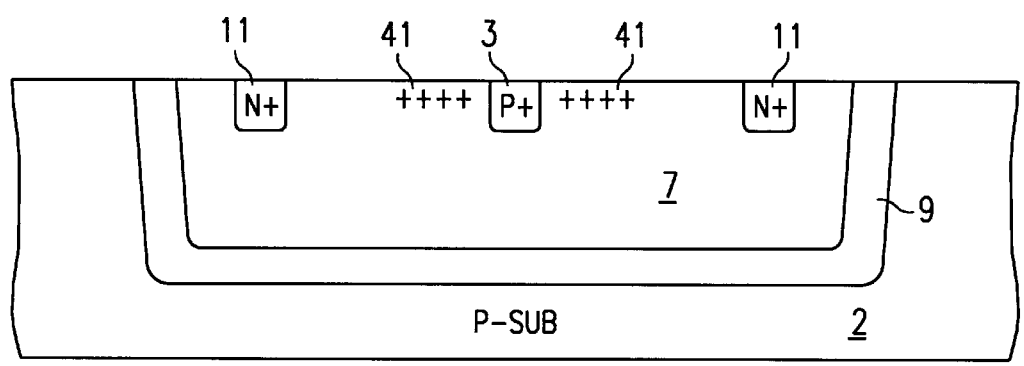
FIG. 5 is a cross section in accordance with a third embodiment of the invention.

As an alternative, either in addition to or in place of the field plate 17, as shown in FIG. 5, the surface of the low voltage N-type tank portion 7 immediately adjacent the P+ region 3 can be lightly positively doped as shown by positive charges 41 to provide the same effect as the field plate or to enhance the effect of the field plate, as the case may be. The light positive doping will repel electrons from the surface of the tank portion 7 and into the bulk of the tank portion 7.

With reference to FIG. 1, which is a top view of the zener diode of FIG. 1 without metallization, there is a rectangular P-type moat 19 (not shown in FIG. 2) at the perimeter of the zener diode structure which provides electrical isolation of the zener diode from other elements on the chip. The following rectangular region 21 is substrate 2. The region 21 is followed by the high voltage N-type portion 9 and then low voltage N-type portion 7. The next rectangle is the N+ region 11 and the rectangular regions 23 therein are contacts within which the cathode metallization and connections 13 to the N+ region will be disposed. The following rectangle 25 is the high voltage N-type portion 9 and low voltage portion 7, followed by a polysilicon region 17 which is the field plate 17. Within the field plate 17 is a rectangle which is the P+ anode region 3 with contacts 27 within which the anode metallization and connections 5 to the P+ region will be disposed.

In operation, under reverse bias, the anode will be at a lower potential than the cathode. The cathode region 11 will be pulled positive with respect to the anode region 3. Once the cathode voltage has reached about 17 volts, the breakdown voltage, the junction between the tank portions 7 and 9 and the anode region 3 breaks down and current is conducted from the N+ region 11 to the P+ region 3 in a lateral direction, but within the bulk of the tank 7 rather than the tank surface due to the effect of the field plate 17. Since the field plate 17 is connected to the anode 5, which has a lower potential than N-type tank 7, 9, positive charge is accumulated along the surface of the N-type tanks 7, 9 near the P-type anode 3.

Figure 3:
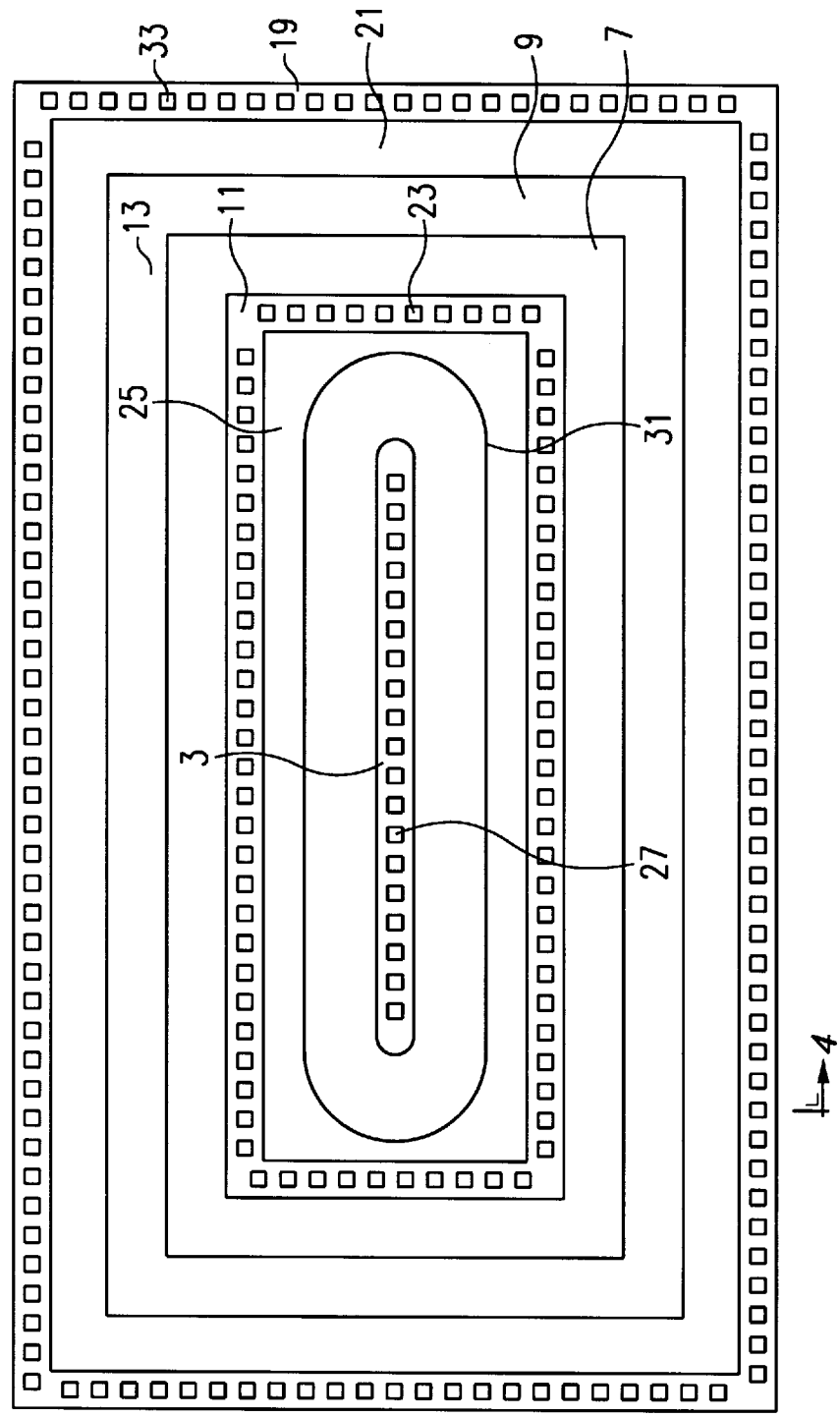
FIG. 3 is a top view of a zener diode, without metallization in accordance with a second embodiment of the present invention.
Figure 4:
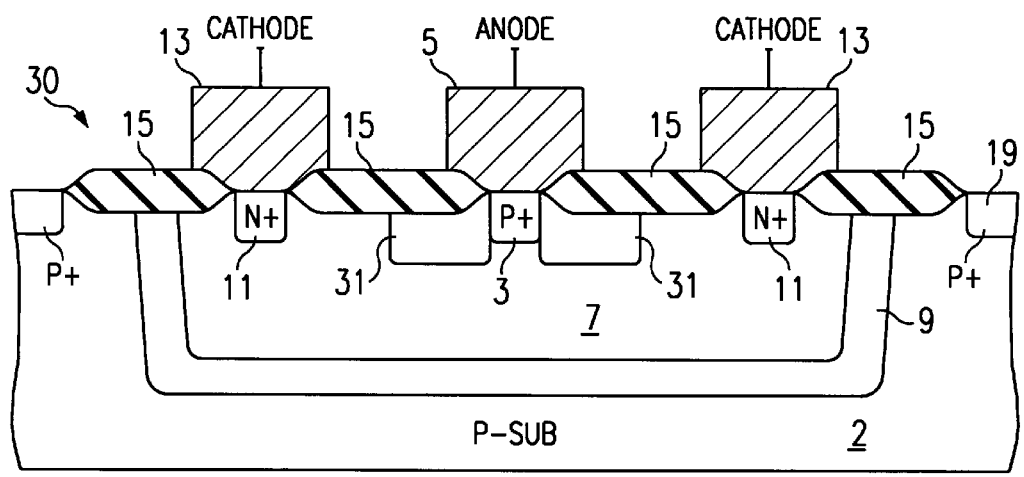
FIG. 4 is a cross section of the zener diode taken along the line 4—4 of FIG. 3 with metallization.

Referring now to FIGS. 3 and 4, there is shown a second embodiment of a zener diode 30 in accordance with the present invention. In this embodiment, like numbers represent like elements in FIGS. 1 and 2. This embodiment has advantages over the embodiment of FIGS. 1 and 2 in that breakdown takes place in a vertical direction along the planar bottom portion of the P+ region 3 within the tank. This decreases the variation in breakdown voltage of the zener diode, this problem being also known as a walking breakdown.

As can be seen in FIG. 4, the polysilicon field plates 17 of FIGS. 1 and 2 have been replaced by a low voltage P-type tank 31 abutting or closely spaced from the P+ region 3 and extending from the surface of the substrate 2 into the tank portion 7 a distance below the P+ region to prevent the "walking" or variation in breakdown voltage problem discussed hereinabove. This embodiment provides a more accurate reference voltage than the embodiment of FIGS. 1 and 2. The improvement is accomplished by forcing the breakdown mechanism into the lower planar part of P+ region 3 of the device, whereas the breakdown occurs near the P+ region corners in the embodiment of FIGS. 1 and 2, this being a cause of any "walking" problem therein. By using the low voltage P-type tank 31, an effective short circuit has been created between the low voltage tank 31 and the P+ region 3. Since the low voltage tank 31 extends deeper into the tank portion 7 than does the P+region 3 and is more lightly doped, its breakdown voltage to the low voltage tank portion 7 and high voltage tank portion 9 is much higher than that of the P+ region. Therefore, as the voltage of the cathode region 11 is increased positively under reverse bias with respect to the anode region 3, the low voltage tank 31 acts as a voltage buffer for the sidewalls of P+ anode region 3, with breakdown taking place at the weakest point, this being the planar junction between the P+ region 3 and the low voltage tank portion region 7. Therefore the breakdown takes place at the bottom of the P+ region 3 as opposed to the corners thereof as in the embodiment of FIGS. 1 and 2. This forces the breakdown into the bulk of the device and thereby greatly minimizes the "walking" problem.

Referring now to FIG. 3 which is a top view of the embodiment of FIG. 4, without metallization the outer P+ ring 19 is for isolation as in FIG. 1. The second ring 21 is substrate 2 as in FIG. 1. The following rectangles are the high voltage tank portion 9 followed by the low voltage tank portion 7. The following rectangle is the N+ cathode region 11, with the contact points 23 therein. The next space 25 is the continuation of N-type tank 7, 9 followed by a oval ring-shaped region which is the low voltage tank 31. The oval within the oval ring-shaped tank portion 31 is the the P+ region 3 with contact points 27.

In operation, everything is as described with reference to FIGS. 1 and 2 except for the vertical direction of the breakdown between the bottom of the P+ region 3 and the N+ region 11 as opposed to corner breakdown.

Figure 6:
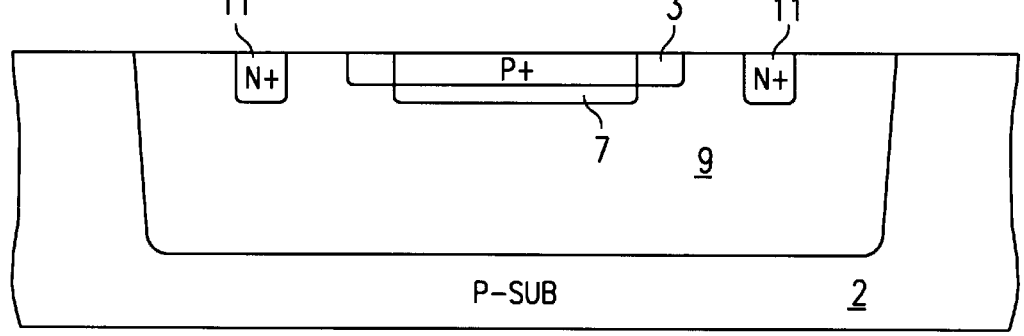
FIG. 6 is a cross section in accordance with a fourth embodiment of the invention.

As an alternative to the embodiment of FIGS. 3 and 4, as shown in FIG. 6, the P+ region 3 is extended laterally beyond the low voltage tank portion 7 so that it extends into the high voltage N-type tank portion 9 but is still spaced from the N+ cathode region 11. Here, a planar junction is established between the P+ region 3 and the low voltage tank portion 7. The advantage is that the low voltage P-type region tank 31 can be omitted.

Though the invention has been described with respect to specific preferred embodiments thereof, many variations and modifications will immediately become apparent to those skilled in the art. It is therefore the intention that the appended claims be interpreted as broadly as possible in view of the prior art to include all such variations and modifications.

We claim:

1. A zener diode, comprising:
   a semiconductor substrate of first conductivity type and having a surface;
   a first tank of second conductivity type, opposite to said first conductivity type, disposed in said substrate; said tank including a relatively higher voltage portion and a relatively lower voltage portion; said higher voltage portion isolating said lower voltage portion from said substrate;

a first region of said first conductivity type disposed in said lower voltage portion; said first region having a bottom portion below said surface;

a second region of said second conductivity type disposed in said lower voltage portion; said second region being more heavily doped than said tank and being spaced from said first region;

contacts provided to said first and second regions; and structure between the first and second regions for repelling majority charge carriers associated with said second conductivity type from between said first and second regions; said structure comprising a second tank of said first conductivity type more lightly doped than said first region, disposed in said substrate abutting said first region, and extending into said first tank from said surface to below said first region bottom portion.

2. The diode of claim 1, wherein said first conductivity type is P-type conductivity type, with said contact to said first region establishing an anode; and said second conductivity type is N-type conductivity type, with said contact to said second region establishing a cathode.

3. The diode of claim 1, wherein said first region is more heavily doped than said substrate.

4. The diode of claim 1, wherein said first region is oval shaped and said second tank is oval ring-shaped and surrounds said first region.

5. The diode of claim 1, wherein said first tank lower voltage portion takes the form of a first rectangular well portion; said first tank higher voltage portion takes the form of a second rectangular well portion located within said first well portion; said first region takes the form of an oval moat area; said second tank takes the form of an oval ring-shaped well surrounding said oval first region; and said second region takes the form of a rectangular moat area surrounding and spaced from said second tank.

6. A zener diode, comprising:

a P-type semiconductor substrate having a surface;

a N-type tank disposed in said substrate; said tank including a relatively lower doped well portion and a relatively higher doped well portion within said lower doped well portion; said lower doped well portion isolating said higher doped well portion from said substrate;

a P-type region disposed in said higher doped well portion; said P-type region being more heavily doped than said substrate and having a bottom portion below said surface;

an N-type region disposed in said higher doped well portion; said N-type region being more heavily doped than said N-type tank and being spaced from said P-type region;

anode and cathode contacts respectively provided to said P-type and N-type regions;

a P-type tank between said P-type and N-type regions, more lightly doped than said P-type region, disposed in said substrate surrounding and abutting said P-type region, and extending into said higher doped well portion to below said P-type region bottom portion.

7. The diode of claim 6, wherein said P-type region is more heavily doped than said substrate.

8. The diode of claim 6, wherein said P-type region is oval shaped and said P-type tank is oval ring-shaped and surrounds said P-type region.

9. The diode of claim 6, wherein said N-type tank higher doped portion takes the form of a first rectangular well portion; said N-type tank lower doped portion takes the form of a second rectangular well portion located within said first well portion; said P-type region takes the form of an oval moat area; said P-type tank takes the form of an oval ring-shaped well surrounding said oval P-type region; and said N-type region takes the form of a rectangular moat area surrounding and spaced from said P-type tank.

* * * * *